United States Patent
Aumüller et al.

(10) Patent No.: US 6,919,618 B2
(45) Date of Patent: Jul. 19, 2005

(54) SHIELDING DEVICE FOR INTEGRATED CIRCUITS

(75) Inventors: Christian Aumüller, Weilheim (DE); Marcus Janke, München (DE); Peter Hofreiter, Otterfing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/637,192

(22) Filed: Aug. 8, 2003

(65) Prior Publication Data

US 2004/0124524 A1 Jul. 1, 2004

Related U.S. Application Data

(63) Continuation of application No. PCT/DE02/00470, filed on Feb. 8, 2002.

(30) Foreign Application Priority Data

Feb. 8, 2001 (DE) .......................................... 101 05 725

(51) Int. Cl.[7] ............................................. H01L 23/552
(52) U.S. Cl. ...................................... 257/659; 257/435
(58) Field of Search ................................ 257/659, 660, 257/435, 432

(56) References Cited

U.S. PATENT DOCUMENTS

| | | | |
|---|---|---|---|
| 4,179,310 A | * 12/1979 | Compton et al. | 438/186 |
| 5,306,942 A | * 4/1994 | Fujii | 257/508 |
| 5,424,235 A | 6/1995 | Nishihara | |
| 5,525,531 A | 6/1996 | Bronner et al. | |
| 5,567,967 A | * 10/1996 | Kusumoto | 257/353 |
| 5,742,082 A | 4/1998 | Tehrani et al. | |
| 5,886,364 A | * 3/1999 | Zhang | 257/53 |
| 5,889,316 A | * 3/1999 | Strobel et al. | 257/659 |
| 5,986,331 A | * 11/1999 | Letavic et al. | 257/664 |
| 6,310,372 B1 | * 10/2001 | Katayama et al. | 257/291 |
| 6,545,371 B1 | * 4/2003 | Matsumoto et al. | 257/660 |
| 6,750,476 B2 | * 6/2004 | Katayama | 257/59 |
| 2002/0040998 A1 | 4/2002 | Lee | |

FOREIGN PATENT DOCUMENTS

| | | |
|---|---|---|
| DE | 199 40 759 A1 | 3/2001 |
| DE | 100 03 112 C1 | 7/2001 |
| EP | 1 014 446 A1 | 6/2000 |
| TW | 303496 | 1/2003 |
| WO | 99/16131 | 4/1999 |
| WO | 00/67319 | 11/2000 |

* cited by examiner

Primary Examiner—S. V. Clark
(74) Attorney, Agent, or Firm—Laurence A. Greenberg; Werner H. Stemer; Ralph E. Locher

(57) ABSTRACT

A shielding device includes optical and/or electrical shielding disposed on the side of the integrated circuit in the semiconductor chip facing the substrate. Preferred configurations use an SOI substrate with the integrated circuit in the body silicon layer and the insulator layer as a device for optical shielding from the bulk silicon layer. Electrical conductors may be present as an optical and electrical shielding device in the bulk silicon layer, and they may be connected to the circuit using vias.

8 Claims, 1 Drawing Sheet

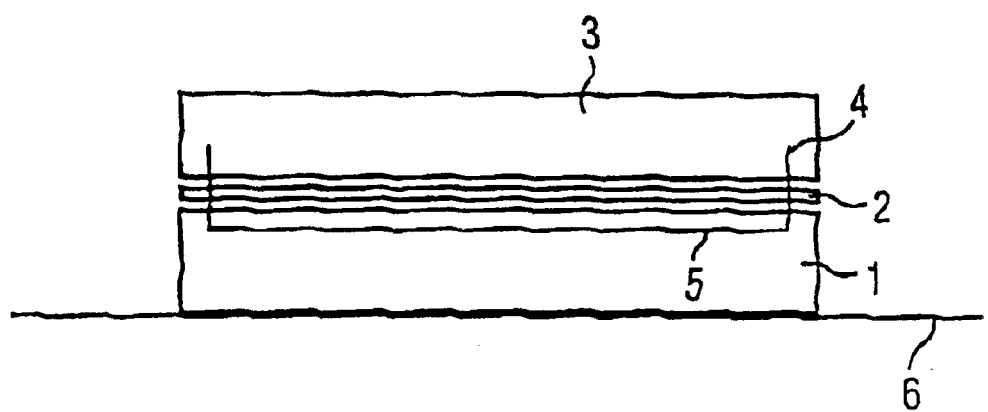

SHIELDING DEVICE FOR INTEGRATED CIRCUITS

CROSS-REFERENCE TO RELATED APPLICATION

This application is a continuation of copending International Application No. PCT/DE02/00470, filed Feb. 8, 2002, which designated the United States and was not published in English.

BACKGROUND OF THE INVENTION

1. Field of the Invention

The present invention relates to a shielding device, with which effective protection against intrusions of an integrated circuit can be achieved.

For integrated circuits in security-relevant applications, the difficulty arises that the circuits need to be protected against intrusions for spying on or analyzing the relevant circuit, e.g., by focused ion beam (FIB). Optical or mechanical analysis methods are also employed.

There are already a number of security concepts with which the integrated circuits can be protected against such intrusions, in particular, provided with a shield. An active shield, in which current-carrying conductor tracks and/or active components are used to shield against an external intrusion of the circuit, is particularly effective in this context. To date, the risk of the circuits being analyzed from the backside of the semiconductor chip, i.e., through the semiconductor substrate, has been ignored.

A so-called Silicon On Insulator (SOI) substrate is widely used in semiconductor technology. In terms of volume, it is, for the most part, a bulk silicon layer on which, separated from the bulk silicon layer by a thin insulator layer, there is a thin, generally crystalline body silicon layer in which the semiconductor components are formed.

SUMMARY OF THE INVENTION

It is accordingly an object of the invention to provide a shielding device for integrated circuits that overcomes the hereinafore-mentioned disadvantages of the heretofore-known devices of this general type and that provides effective protection against intrusions of integrated circuits from the substrate backside.

With the foregoing and other objects in view, in a semiconductor chip having a substrate with an integrated circuit, there is provided, in accordance with the invention, a shielding device for the integrated circuit including a shield disposed on a side of the integrated circuit in the semiconductor chip facing the substrate, the shield at least one of optically and electrically shielding the integrated circuit.

The shielding device according to the invention includes measures for optical and/or electrical shielding, which are disposed on the side of the integrated circuit in the semiconductor chip facing the substrate. Preferred configurations use an SOI substrate to form the integrated circuit in the body silicon layer of the SOI substrate and to use the insulator layer of the SOI substrate as a device for optical shielding from the bulk silicon layer.

In accordance with a further feature of the invention, the substrate is an SOI substrate and the shield is an insulation layer of the substrate.

In accordance with an added feature of the invention, the substrate is an SOI substrate having a bulk silicon layer, a body silicon layer having at least one component formed therein, and an insulator layer having a via, the conductor is disposed in the bulk silicon layer, and the via electrically connects the conductor to at least one of the body silicon layer and the component.

In accordance with another feature of the invention, electrical conductors, in particular, conductor tracks or conductor surfaces, are provided as a shielding device in the bulk silicon layer of an SOI substrate, preferably, in the vicinity of the insulator layer. These conductors may be connected by one or more vias, which pass through the insulation layer into the body silicon layer, to the body silicon layer or to one or more components of the circuit that are present in the body silicon layer. As such, the conductors disposed in the bulk silicon layer can be operated actively.

In accordance with an additional feature of the invention, the shield is at least one conductor disposed in the substrate on the side of the integrated circuit facing the substrate.

In accordance with yet another feature of the invention, the conductor is an element selected from the group consisting of a conductor surface, a conductor track, a conductor grid and a conductor double grid.

In accordance with a concomitant feature of the invention, the conductor is a doped region in the substrate.

Other features that are considered as characteristic for the invention are set forth in the appended claims.

Although the invention is illustrated and described herein as embodied in a shielding device for integrated circuits, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

The FIGURE is a fragmentary, cross-sectional view of an SOI substrate having a conductor structure disposed according to the invention.

DESCRIPTION OF THE PREFERRED EMBODIMENTS

In the FIGURE, the thicknesses of the layers are not represented true to scale because it is only the fundamental configuration of the layers relative to one another that is important.

Referring now to the single FIGURE of the drawing, it is seen that a SOI substrate has a bulk silicon layer 1 that, as a silicon body, forms the part that substantially makes up the volume of the substrate, a thin insulator layer 2 placed thereon or formed in the silicon body, and a likewise thin, preferably, crystalline body silicon layer 3, in which the semiconductor components of the integrated circuit are formed.

In the FIGURE, vertical lines are used to represent electrically conductive vias 4 that pass through the insulator layer 2 and electrically connect the body silicon layer 3 to the bulk silicon layer 1. In the body silicon layer 3, these vias 4 may be joined in any desired way to components of an integrated circuit in the body silicon layer 3. The vias 4 are electrically conducted to conductors 5 that are placed in the bulk silicon layer 1, preferably, in the vicinity of the insulator layer 2. These electrical conductors may be configured in the form of conductor tracks, which may be structured as a grid or as a double grid, or in the form of conductor surfaces or the like. These conductors 5 may be produced during the fabrication of the substrate by dopant implantation in the semiconductor material of the bulk silicon layer 1. It is advantageous for the conductors 5 to cover as large as possible an area of the substrate surface. In the example, the SOI substrate is mounted on a module support 6, although the latter is not essential to the invention.

The use of an SOI substrate even in the case of semiconductor circuits for which an SOI substrate is not normally provided, has the effect that optical inspection by backside infrared microscopy is no longer possible due to the different refractive indices of the semiconductor material and the insulator. The insulator layer, therefore, forms a shielding device according to the invention. In a conventional semiconductor substrate, or, especially, in the bulk silicon layer of an SOI substrate, as in the exemplary embodiment which is described, electrical conductors may be provided as shielding components; in particular, these conductors may be actively operated using components of the integrated circuit through vertical electrical connections, e.g., the vias that have been described.

In configurations with electrical conductors as a shielding device on the substrate side of the semiconductor chip, and electrical connection between these conductors and the integrated circuit, it is possible, in particular, to apply signal pulses to the conductors of the shielding device and, by subsequent verification of these applied signal pulses, to detect possible manipulations from the backside of the substrate, i.e., from the bulk silicon layer in the exemplary embodiment with an SOI substrate. Such a configuration provides an active backside shield.

Although the use of an SOI substrate is preferred according to the invention, active backside shielding of the substrate may also be provided for a conventional substrate without an insulation layer. Such a shield works, in principle, like an active shield on the top side of the IC chip.

We claim:

1. A semiconductor chip, comprising
   a SOI substrate having an integrated circuit and
   a shielding device for said integrated circuit, said shielding device having a shield disposed on a side of said integrated circuit in the semiconductor chip facing said SOI substrate, said shield at least one of optically and electrically shielding said integrated circuit, said shield being an insulation layer of said SOI substrate.

2. A semiconductor chip, comprising
   a SOI substrate having an integrated circuit, said SOI substrate having:
      a bulk silicon layer;
      a body silicon layer having at least one component formed therein; and
      an insulator layer having a via, said insulator layer disposed between said bulk silicon layer and said body silicon layer;
   a shielding device for said integrated circuit, said shielding device having a shield disposed on a side of said integrated circuit in the semiconductor chip facing said SOI substrate, said shield at least one of optically and electrically shielding said integrated circuit, said shield being at least one conductor disposed in said SOI substrate on said side of said integrated circuit facing said SOI substrate, said conductor disposed in said bulk silicon layer; and
   said via electrically connecting said conductor to at least one of said body silicon layer and said component.

3. The shielding device according to claim 2, wherein said conductor is an element selected from the group consisting of a conductor surface, a conductor track, a conductor grid and a conductor double grid.

4. A semiconductor chip, comprising
   a substrate having an integrated circuit; and
   a shielding device for said integrated circuit, said shielding device having a shield disposed on a side of said integrated circuit in the semiconductor chip facing said substrate, said shield at least one of optically and electrically shielding said integrated circuit, said shield being at least one conductor disposed in said substrate on said side of said integrated circuit facing said substrate, said conductor being a doped region in said substrate.

5. A semiconductor chip, comprising:
   a SOI substrate having an integrated circuit and
   a shielding device for said integrated circuit, said shielding device having shield means for at least one of optical and electrical shielding said integrated circuit and disposed on a side of said integrated circuit in the semiconductor chip facing said SOI substrate, said shielding means being an insulation layer of said SOI substrate.

6. A semiconductor chip, comprising:
   a SOI substrate having an integrated circuit, said SOI substrate having:
      a bulk silicon layer;
      a body silicon layer having at least one component formed therein; and
      an insulator layer having a via, said insulator layer disposed between said bulk silicon layer and said body silicon layer;
   a shielding device for said integrated circuit, said shielding device having shielding means for at least one of optical and electrical shielding said integrated circuit and disposed on a side of said integrated circuit in the semiconductor chip facing said SOI substrate, said shielding means is at least one conductor disposed in said SOI substrate on said side of said integrated circuit facing said SOI substrate, said conductor disposed in said bulk silicon layer; and
   said via electrically connecting said conductor to at least one of said body silicon layer and said component.

7. The shielding device according to claim 6, wherein said conductor is an element selected from the group consisting of a conductor surface, a conductor track, a conductor grid and a conductor double grid.

8. A semiconductor chip, comprising:
   a substrate having an integrated circuit; and
   a shielding device for said integrated circuit, said shielding device having shielding means for at least one of optical and electrical shielding said integrated circuit and disposed on a side of said integrated circuit in the semiconductor chip facing said substrate, said shielding means is at least one conductor disposed in said substrate on said side of said integrated circuit facing said substrate, said conductor being a doped region in said substrate.

* * * * *